US009484482B2

United States Patent
Hsu et al.

(10) Patent No.: US 9,484,482 B2
(45) Date of Patent: Nov. 1, 2016

(54) EFFICIENT OPTICAL (LIGHT) COUPLING

(71) Applicant: International Business Machines Corporation, Armonk, NY (US)

(72) Inventors: Hsiang Han Hsu, Yokohama (JP); Shigeru Nakagawa, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/748,276

(22) Filed: Jun. 24, 2015

(65) Prior Publication Data

US 2015/0378095 A1    Dec. 31, 2015

(30) Foreign Application Priority Data

Jun. 26, 2014   (JP) ................. 2014-131007

(51) Int. Cl.
| | | |
|---|---|---|
| G02B 6/12 | (2006.01) | |
| H01L 31/18 | (2006.01) | |
| H01L 31/167 | (2006.01) | |
| G02B 6/42 | (2006.01) | |
| G02B 6/34 | (2006.01) | |
| G02B 6/43 | (2006.01) | |

(52) U.S. Cl.
CPC .............. *H01L 31/18* (2013.01); *G02B 6/4214* (2013.01); *H01L 31/167* (2013.01); *G02B 6/34* (2013.01); *G02B 6/4249* (2013.01); *G02B 6/43* (2013.01)

(58) Field of Classification Search
CPC ........... G02B 2006/12104; G02B 2006/12107
See application file for complete search history.

(56) References Cited

U.S. PATENT DOCUMENTS

| | | | |
|---|---|---|---|
| 6,331,382 B1* | 12/2001 | Robertsson | G02B 6/122 219/121.68 |
| 7,162,124 B1 | 1/2007 | Gunn, III et al. | |
| 8,625,942 B2 | 1/2014 | Na et al. | |
| 8,644,656 B2* | 2/2014 | Yanagisawa | G02B 6/43 361/748 |
| 9,201,200 B2* | 12/2015 | Bowen | G02B 6/30 |
| 2006/0140569 A1* | 6/2006 | McDonald | H01S 5/0265 385/129 |
| 2009/0003762 A1 | 1/2009 | Chiniwalla et al. | |
| 2009/0220195 A1* | 9/2009 | Van Der Keur | G01J 3/02 385/31 |

(Continued)

FOREIGN PATENT DOCUMENTS

| | | |
|---|---|---|
| JP | S59-121008 A | 7/1984 |
| JP | 2000121854 A | 4/2000 |

(Continued)

OTHER PUBLICATIONS

Roelkens et al., "High efficiency Silicon-on-Insulator grating coupler based on a poly-Silicon overlay", Nov. 27, 2006 / vol. 14, No. 24 / Optics Express, pp. 11622-11630.

(Continued)

*Primary Examiner* — Omar R Rojas
(74) *Attorney, Agent, or Firm* — Jason H. Sosa

(57) ABSTRACT

A light coupling structure is provided that includes a diffractive grating coupler, a total internal reflection (TIR) mirror, and a polymer waveguide. The TIR mirror is formed within the polymer waveguide to direct light signals between the diffractive grating coupler and the polymer waveguide.

17 Claims, 14 Drawing Sheets

(56) References Cited

U.S. PATENT DOCUMENTS

| | | | |
|---|---|---|---|
| 2009/0290837 A1 | 11/2009 | Chen et al. | |
| 2010/0322555 A1* | 12/2010 | Vermeulen | G02B 6/12007 385/28 |
| 2011/0182548 A1 | 7/2011 | Kopp et al. | |
| 2011/0188808 A1 | 8/2011 | Hofrichter et al. | |
| 2013/0182998 A1 | 7/2013 | Andry et al. | |
| 2013/0209026 A1 | 8/2013 | Doany et al. | |
| 2014/0029888 A1* | 1/2014 | La Porta | H05K 13/00 385/2 |
| 2014/0029894 A1 | 1/2014 | Bowen | |
| 2015/0286008 A1 | 10/2015 | Shimizu et al. | |

FOREIGN PATENT DOCUMENTS

| | | |
|---|---|---|
| JP | 2002506227 A | 2/2002 |
| JP | 2004177730 A | 6/2004 |
| JP | 2013250436 A | 12/2013 |
| JP | 2014048493 | 3/2014 |
| JP | 2015522854 A | 8/2015 |
| WO | 2014034458 A1 | 3/2014 |

OTHER PUBLICATIONS

Roelkens et al., "Interfacing optical fibers and high refractive index contrast waveguide circuits using diffractive grating couplers", Proc. of SPIE vol. 7218, 721808—© 2009 SPIE—CCC code: 0277-786X/09, 10 pages, doi: 10.1117/12.808909.

Shu et al., "Efficient coupler between chip-level and board-level optical waveguides", Optics Letters / vol. 36, No. 18 / Sep. 15, 2011, pp. 3614-3616.

Soganci et al., "Flip-chip optical couplers with scalable I/O count for silicon photonics'", Jul. 1, 2013, vol. 21, No. 13, DOI:10.1364/OE.21.016075, Optics Express, pp. 16075-16085.

Soganci et al., "Multichannel Optical Coupling to a Silicon Photonics Chip Using a Single-Step Bonding Process", 2013 IEEE Photonics Conference (IPC), Sep. 8-12, 2013, Bellevue, WA, pp. 115-116, 978-1-4577-1506-8, DOI:10.1109/IPCon.2013.6656398.

Japan Patent Application No. 2014-131007, entitled "Light Coupling Structure, Semiconductor Device, Optical Interconnect Structure for Multi-Chip Module and Production Method for Light Coupling Structure", filed Jun. 26, 2014.

"Super High Accuracy Flip Chip Bonder (for optical devices) OF2000", Toray Engineering, url provided by inventors in post disclosure comments dated Feb. 24, 2014, <http://www.toray-eng.com/semicon/bonder/flip-lineup/of2000.html>, 4 pages.

* cited by examiner

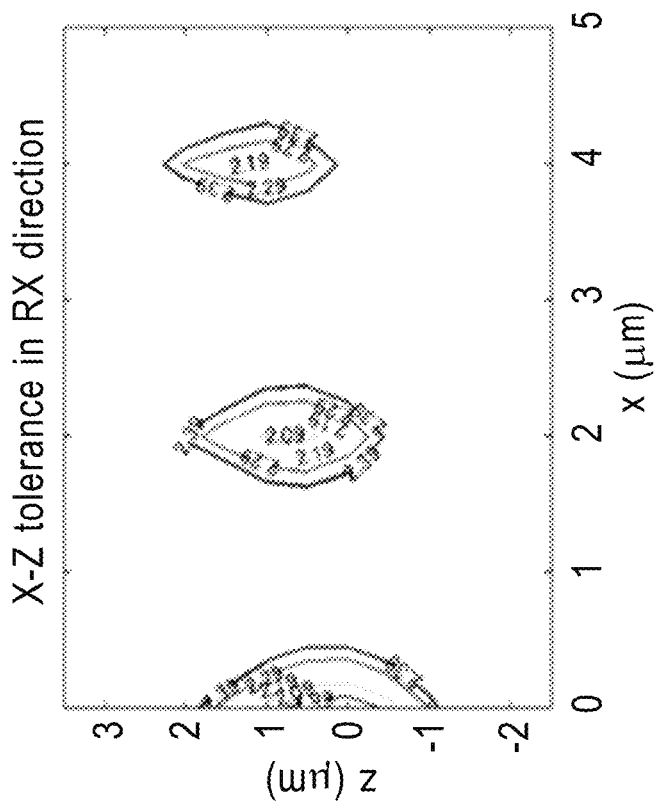
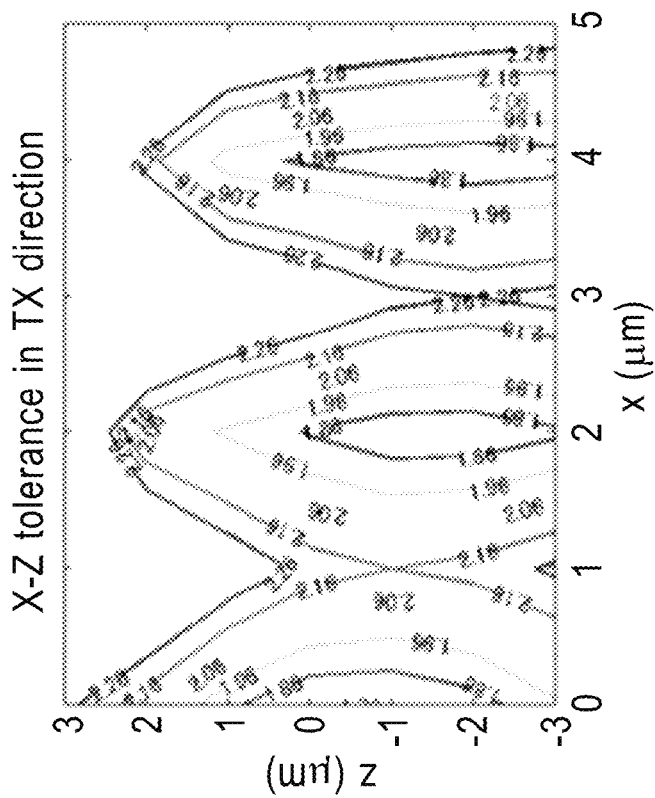
FIG. 6B
FIG. 6A

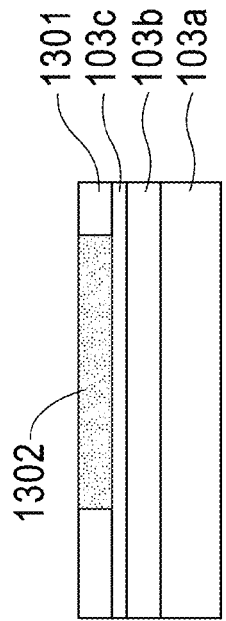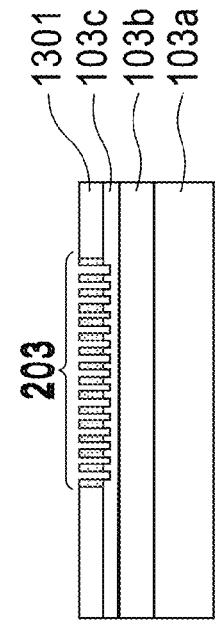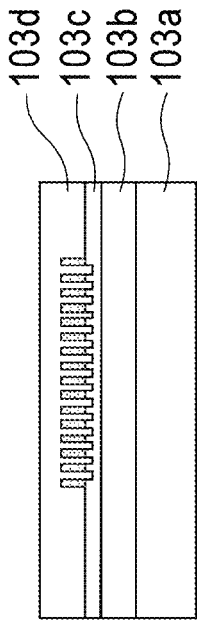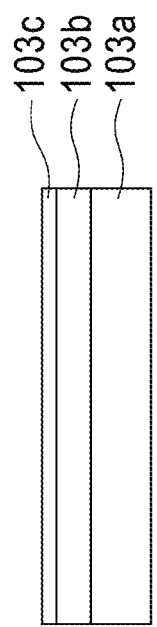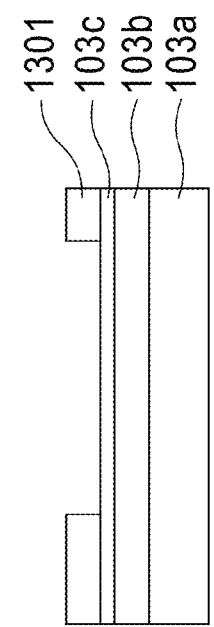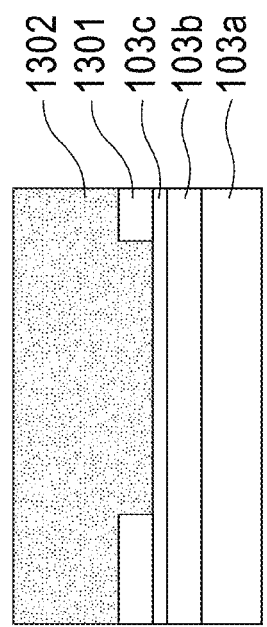

US 9,484,482 B2

EFFICIENT OPTICAL (LIGHT) COUPLING

CROSS-REFERENCE TO RELATED APPLICATIONS

This Application claims the benefit of priority to Japanese Patent Application 2014-131007, filed on Jun. 26, 2014, the contents of which are hereby incorporated by reference.

BACKGROUND

The present invention relates generally to semiconductor devices utilizing optical interconnects, and more particularly, to improving coupling efficiency between such devices.

As semiconductor devices process larger amounts of information, higher communication speeds between such devices are desirable. In order to address this desire, silicon photonics, an optical communication technology in which data is transferred among computer chips by optical rays, has been increasingly developed.

Traditional microchips (ICs or chips) utilize electrical interconnections between embedded devices and other chips to process and move data. Silicon photonic chips utilize optical interconnects to allow communication to occur between devices and chips through the propagation of light. Optical, or light, coupling refers to a method of interconnecting two devices to transfer an optical signal using light waves, and is often accomplished through the use of a coupling device or coupler. Optical coupling devices are often made up of a planer waveguide and a diffractive grating coupler (DGC) formed on a silicon-on-insulator (SOI) device and a second planer waveguide. Such waveguides may be used as multimode waveguides; however, single mode waveguides may be preferable due to the relative quality of communication and attenuation of light propagating in the waveguide.

SUMMARY

One embodiment of the present invention provides a light coupling structure. The light coupling structure may include: a silicon based waveguide including a diffractive grating coupler for directing a light signal; a polymer waveguide in which the light signal may propagate between the silicon based waveguide and optical wiring; a total internal reflection (TIR) mirror formed within the polymer waveguide at an angle such that at least a portion of the light signal, either directed from the diffractive grating coupler or from the optical wiring via the polymer waveguide, intersects the TIR mirror and is reflected into the other of the diffractive grating coupler or the polymer waveguide; and the optical wiring, optically coupled to the polymer waveguide such that light may pass between the optical wiring and the polymer waveguide.

A second embodiment of the present invention provides a semiconductor device. The semiconductor device may include: a silicon photonics chip formed by a silicon-on-insulator (SOI) structure and including a silicon based waveguide with a diffractive grating coupler on a buried oxide layer of the SOI structure; and a polymer waveguide in which a light signal may propagate between the silicon photonics chip and a separate optical medium; and a total internal reflection (TIR) mirror formed within the polymer waveguide at an angle such that at least a portion of a light signal traveling from either the silicon photonics chip or the polymer waveguide intersects the TIR mirror and is reflected towards the other of the silicon photonics chip or the polymer waveguide.

A third embodiment of the present invention provides a method for forming a light coupling structure. The method may comprise: forming a polymer waveguide on an organic substrate; removing an angular portion of the polymer waveguide such that an angled void is created within the polymer waveguide having at least two parallel surfaces to create a total internal reflection (TIR) mirror; forming a via plug filled with an electric conducting material in the polymer waveguide; soldering a silicon photonics chip, having a diffractive grating coupler, to the via plug such that electric signals may pass between the silicon photonics chip and the polymer waveguide by way of the via plug, the silicon photonics chip positioned such that at least a portion of a light signal traveling from the polymer waveguide can be directed at the diffractive grating coupler by the TIR mirror and at least a portion of a light signal traveling from the silicon photonics chip can be directed at the TIR mirror by the diffractive grating coupler.

BRIEF DESCRIPTION OF THE SEVERAL VIEWS OF THE DRAWINGS

FIGS. 6 (A & B) shows two dimensional positioning tolerances of the light coupling structure.

FIG. 13 (A-F) shows a production method of the diffractive grating coupler, in accordance with one embodiment of the present invention.

DETAILED DESCRIPTION

Embodiments of the present invention provide a light coupling structure for coupling between a silicon photonic chip and an organic structure, such as a circuit board.

Figure 1:
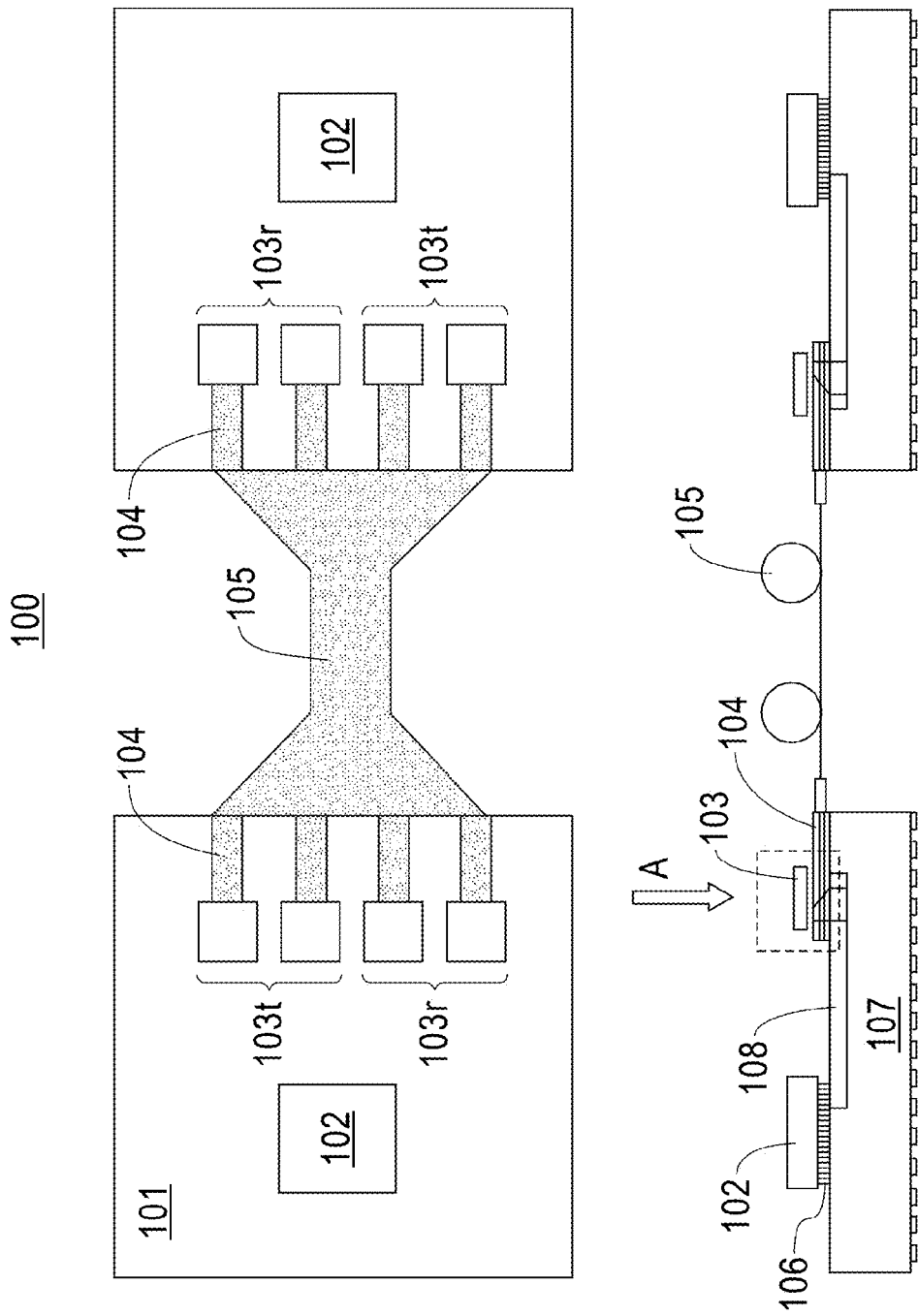
FIG. 1 shows the schematic structure of an optical interconnect structure, in accordance with one embodiment of the present invention.

Embodiments of the present invention will be described herein with reference to the drawings; however, the present invention is not limited to the disclosed embodiments and examples. FIG. 1 shows the schematic structure of optical interconnect structure 100. Optical interconnect structure 100 generally comprises an organic substrate, depicted in the present embodiment as circuit board 107, and silicon photonics (Si-Ph) chips 103. Si-Ph chips 103 may utilize silicon-on-insulator technology in which optical facilities, such as, for example, a vertical cavity surface emitting laser (VCSEL) or photodiode are incorporated. As depicted, Si-Ph chips 103 are integrated on circuit board 107 to form optical multi-chip module (MCM) 101. Circuit board 107 includes metal wirings and/or waveguide wirings through which electrical and/or optical signals may propagate.

Circuit board 107 may be composed of, for example, a composite epoxy material, and may have mounted a plurality of Si-Ph chips 103 allowing optical communication between circuit board 107 and CPU or ASIC 102 thereon. CPU or ASIC 102 is used for various kinds of data processing and may be mounted on circuit board 107 by conventional C4 connections 106. CPU or ASIC 102 may electronically communicate to Si-Ph chips 103 through metal wirings 108 embedded in circuit board 107, such that communication between the CPU or ASIC may be attained.

Metal wirings 108 may be connected to Si-Ph chips 103 from CPU or ASIC 102 through via plugs (not shown) so that optical communication to another MCM can be achieved via the Si-Ph chips. Si-Ph chips 103 are amounted to circuit board 107 through light coupling structure 104, disposed between circuit board 107 and Si-Ph chips 103. Light coupling structure 104 may be formed in the organic substrate. Si-Ph chips 103 may comprise a parallel data transfer capability, such as 24 channels in transmission, and/or reception through the bundle of 24 single mode optical fibers. Additional or alternative communication capabilities may be used. For example, Si-Ph chips 103t may be operated in a transmission mode and Si-Ph chips 103r may be operated in a receiver mode.

Light coupling structure 104 generally comprises a single mode-polymer waveguide (SM-PWG) and an optical element, e.g., a total internal reflection (TIR) mirror, and in one embodiment receives optical signals from Si-Ph chips 103t and transfers received light to optical wirings 105 through a coupling mechanism. In turn, Si-Ph chip 103r, in this embodiment, would receive light signals from Si-Ph chips 103t of a connected MCM through optical wirings 105 of light coupling structure 104. Optical wirings 105 may be formed as a planer waveguide or may be formed as optical fiber(s). In one embodiment, a plurality of optical wirings may be collected into a single bundle as shown in FIG. 1.

In one embodiment, optical wirings 105 may also be a waveguide allowing single mode light propagation, which may desirable for communication quality and attenuation of the light signals when long distance communication is requested. In other embodiments, the waveguide may be implemented in multi-mode optical communication.

Figure 2:
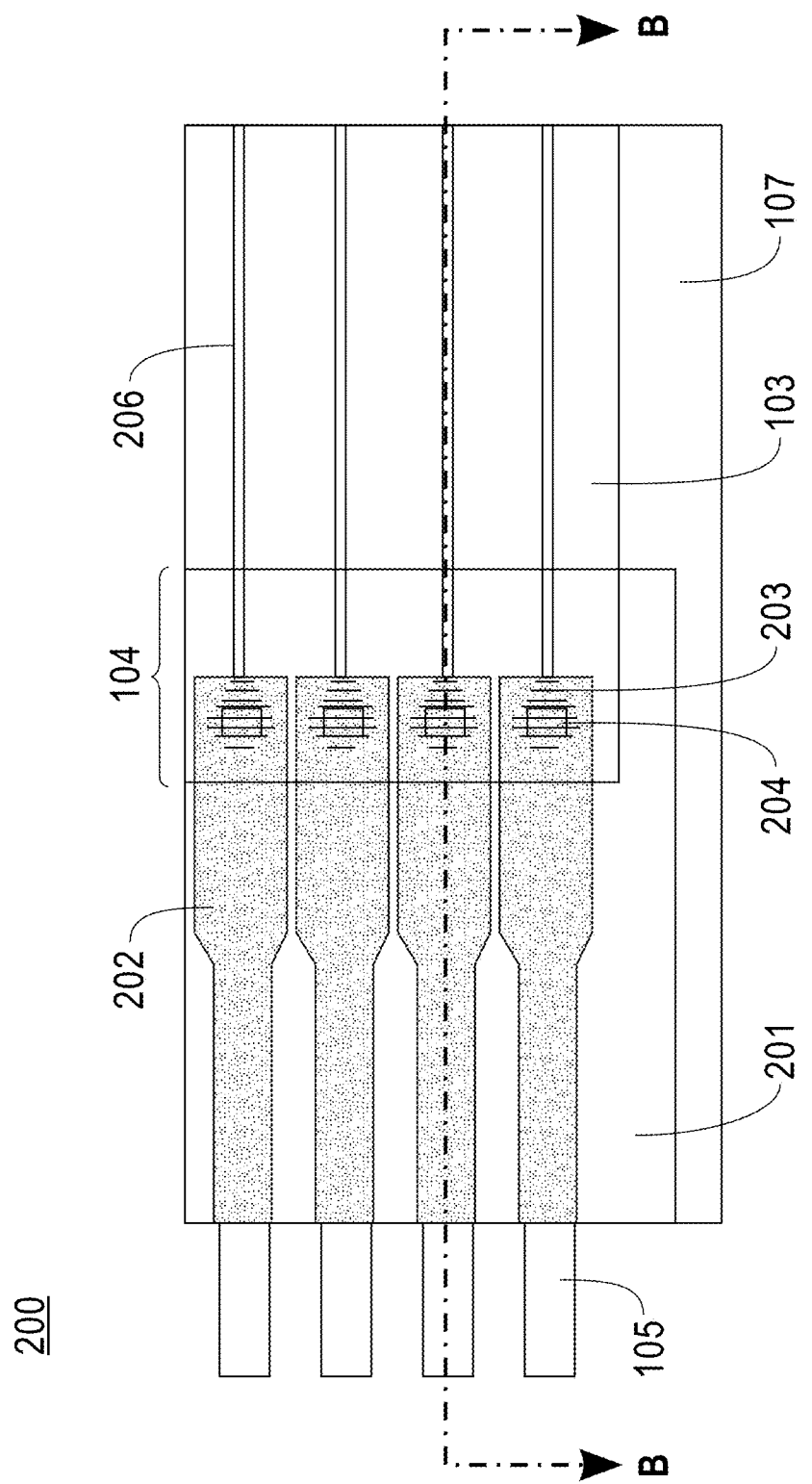
FIG. 2 shows a top view of the optical interconnect structure comprising a silicon photonic (Si-Ph) chip, a polymer waveguide, and an organic structure, in accordance with one embodiment of the present invention.

FIG. 2 shows top view 200 of optical interconnect structure 100 when Si-Ph chips 103 and light coupling structure 104 are mounted on circuit board 107. Top view 200 corresponds to the region identified with the arrow A in FIG. 1. In FIG. 2, Si-Ph chips 103 placed at the top of the structure are shown as transparent for the sake of description. Optical organic layer 201 mounts to the organic substrate, e.g., circuit board 107, and is the surface in which SM-PWGs 202 and optical reflection elements 203 and 204 are formed. As depicted, light coupling structure 104 comprises SM-PWG 202 and TIR mirror 204, with diffractive grating coupler 203 overlying light coupling structure 104 and acting as an additional optical reflection element. In some embodiments, DGC 203 may be considered part of light coupling structure 104.

Over light coupling structure 104, at least one Si-Ph chip 103 is placed, through proper electronic contacts such as solder balls (not shown). In one embodiment, light coupling structure 104 is formed with optical grade polymer materials such as polycarbonate, poly-methyl methacrylate, poly alkylsiloxane, silsesquioxane, epoxy resin, epoxy-silicone resin, chelate polymer or the like. In general, light coupling structure 104 comprises an optical waveguide, preferably an SM-PWG, for allowing single mode light propagation in light coupling structure 104. Layers of the waveguide may be formed by known methods, such as spin-coating or dry film lamination techniques.

The top view of SM-PWGs 202 is shown, with one end of SM-PWGs 202 overlapping Si-Ph chip 103, and the other end coupled to optical fiber 105 acting as the optical wiring. Optical fiber 105 may be a single mode optical fiber or a single mode waveguide. The overlapped region depicted contains at least a portion of light coupling structure 104, and shows diffractive grating coupler (DGC) 203 overlying TIR mirror 204 such that the optical signal may be interconnected between Si-Ph chip 103 and SM-PWGs 202. Each of DGCs 203 is formed by arrayed ridges of silicon, where the length of each ridge runs across (substantially perpendicular to) the direction of light propagation, and the length of each ridge across the light propagation axis is adjusted such that along the series of ridges, the respective lengths taper or shorten as they near the light propagation directions, i.e., the length of ridges in the center region is longer than ridges within edge regions. This helps to improve the light coupling efficiency. A detailed construction of the light coupling structure is detailed with regard to FIG. 3.

Si-Ph chip 103 comprises a silicon semiconductor deposited on a buried oxide (BOX) layer. Si-Ph chip 103 further comprises a planer waveguide 206 connected to DGC 203 on the BOX layer such that the Si-Ph chip 103 may send and receive optical signals and propagate optical signals through waveguides 206 acting as optical wiring connections to other semiconductor devices. DGC 203 of planer waveguide 206 in Si-Ph chip 103 may be formed on the cladding layer thereof such that the optical signal propagating in waveguide 206 may be sent outside the waveguide, and in turn the optical signal propagating in the optical wirings 105 may be introduced into waveguide 206.

Figure 3:
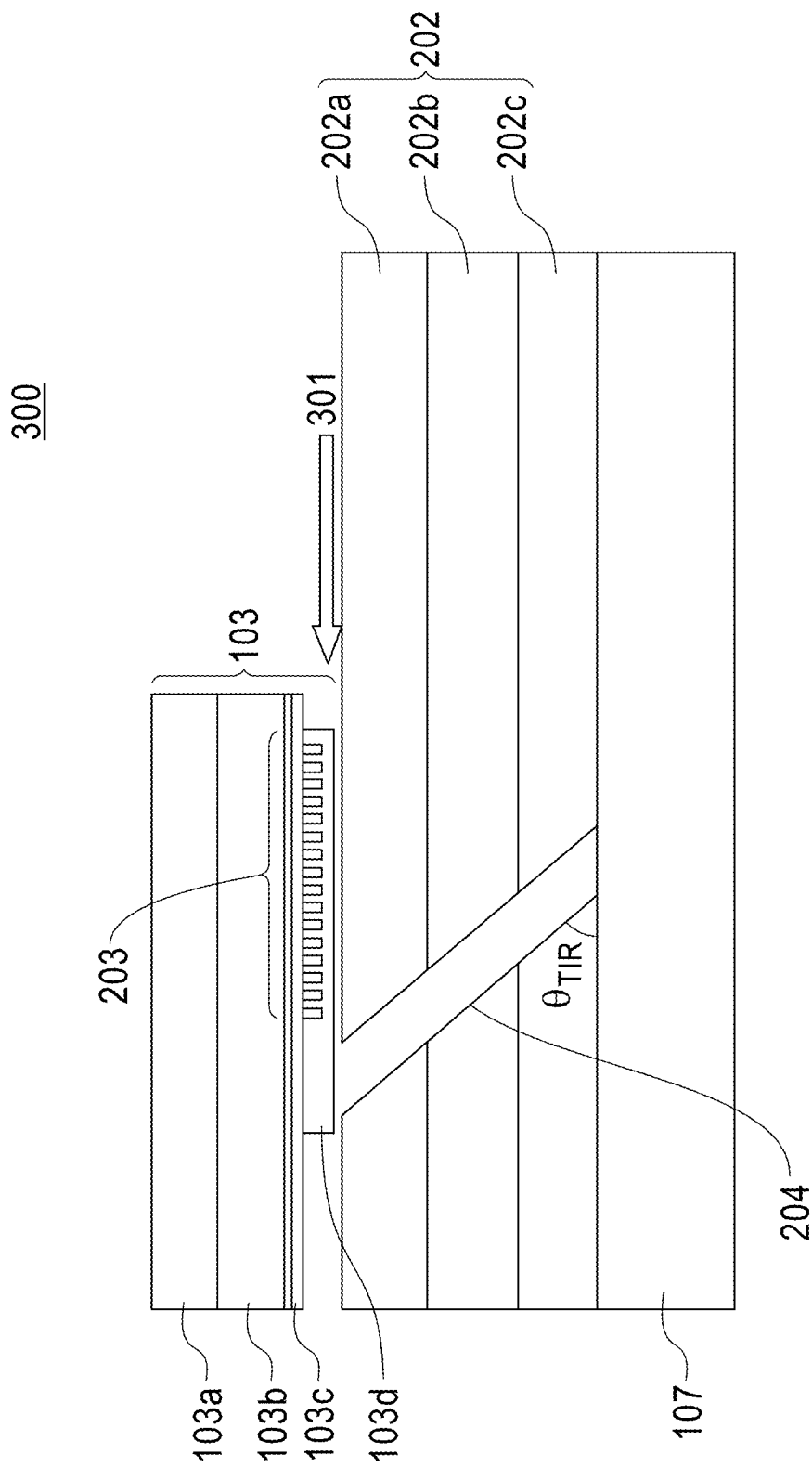
FIG. 3 shows a detailed construction of a light coupling structure, in accordance with one embodiment of the present invention.

Now, with reference to FIG. 3, a detailed construction of light coupling structure 104 is detailed, in accordance with one embodiment, using cross sectional view 300 along with the line B-B of FIG. 2. As depicted, Si-Ph chip 103 is placed on the top of light coupling structure 104, light coupling structure 104 including at least SM-PWG 202 and TIR mirror 204, and overlying circuit board 107. Si-Ph chip 103 includes silicon substrate 103a, buried oxide layer 103b, and planar waveguide 103c which corresponds to the planar waveguide 206 in the top view shown in FIG. 2. On the cladding facing SM-PWG 202, DGC 203 is formed using one or more of chemical mechanical polishing, photolithography, and other known patterning processes.

In one embodiment, DGC 203 is covered by, at least, passivation layer 103d. Passivation layer 103d may be composed of, for example, silicon dioxide, silicon carbide, silicon nitride, etc. depending on a particular application and their refractive indices.

Si-Ph chip 103 is disposed on light coupling structure 104 with a slight air gap 301. Air gap 301, in one embodiment, is obtained utilizing electronic conductive spacers such as solder balls (not shown). In another embodiment, air gap 301 may be omitted, which may be desirable depending on strength and process durability under fabrication processes of passivation layer 103d.

As depicted, SM-PWG 202 in light coupling structure 104 includes outer layers 202a and 202c, acting as cladding layers, and inner layer 202b, acting as the core within which optical signals may propagate. Outer layers 202a and 202c, in one embodiment, are about 5 micrometers, and inner layer 202b may be about 8 micrometers. TIR mirror 204 is formed within SM-PWG 202 at a slant angle $\theta_{TIR}$, with respect to the horizontal direction of the figure and extends transversely across at least the core of SM-PWG 202. TIR mirror 204 is defined inside SM-PWG 202 by substantially parallel polymer surfaces leaving a given space therebetween. TIR mirror 204 may reflect an optical signal propagating inside core layer 202b toward DGC 203, which in turn may introduce the optical signal into planar waveguide 103c in a receiver mode.

The inside of the parallel polymer surfaces of TIR mirror 204 is filled with an appropriate inert gas material such as air, nitrogen, He, Ne, Ar, $CO_2$, etc., which each may provide varying reflection performances. An optical signal propagating inside waveguide 103c may be guided into core layer 202b of SM-PWG 202 by reflection of TIR mirror 204 in a transmitter mode. The slant angle $\theta_{TIR}$ of TIR mirror 204 may provide relatively large tolerances for the relative alignment between Si-Ph chip 103 and light coupling structure 104.

Figure 4:
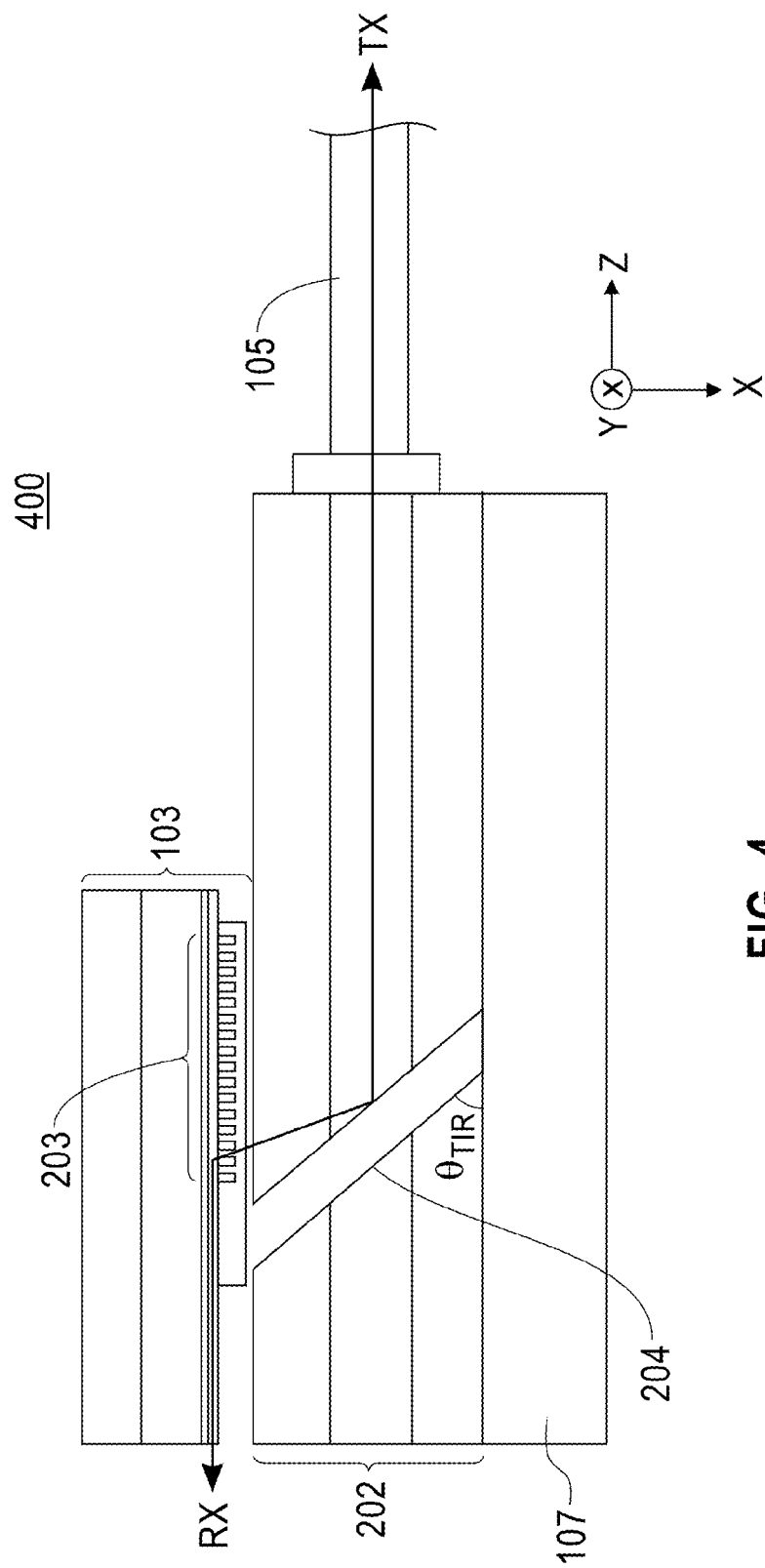
FIG. 4 shows one embodiment of light propagation inside the optical interconnect structure.

FIG. 4 shows practical embodiment 400 of light coupling structure 104 within optical interconnect structure 100. As shown, direction of light in the transmitter mode is referred to by TX and direction of light in the receiver mode is referred to by RX. SM-PWG 202 and optical fiber 105 are coupled and an optical signal traveling through SM-PWG 202 is reflected by TIR mirror 204 toward DGC 203, which is then sent into the corresponding planer waveguide Si-Ph chip 103, as shown by the arrow RX.

Figure 5:
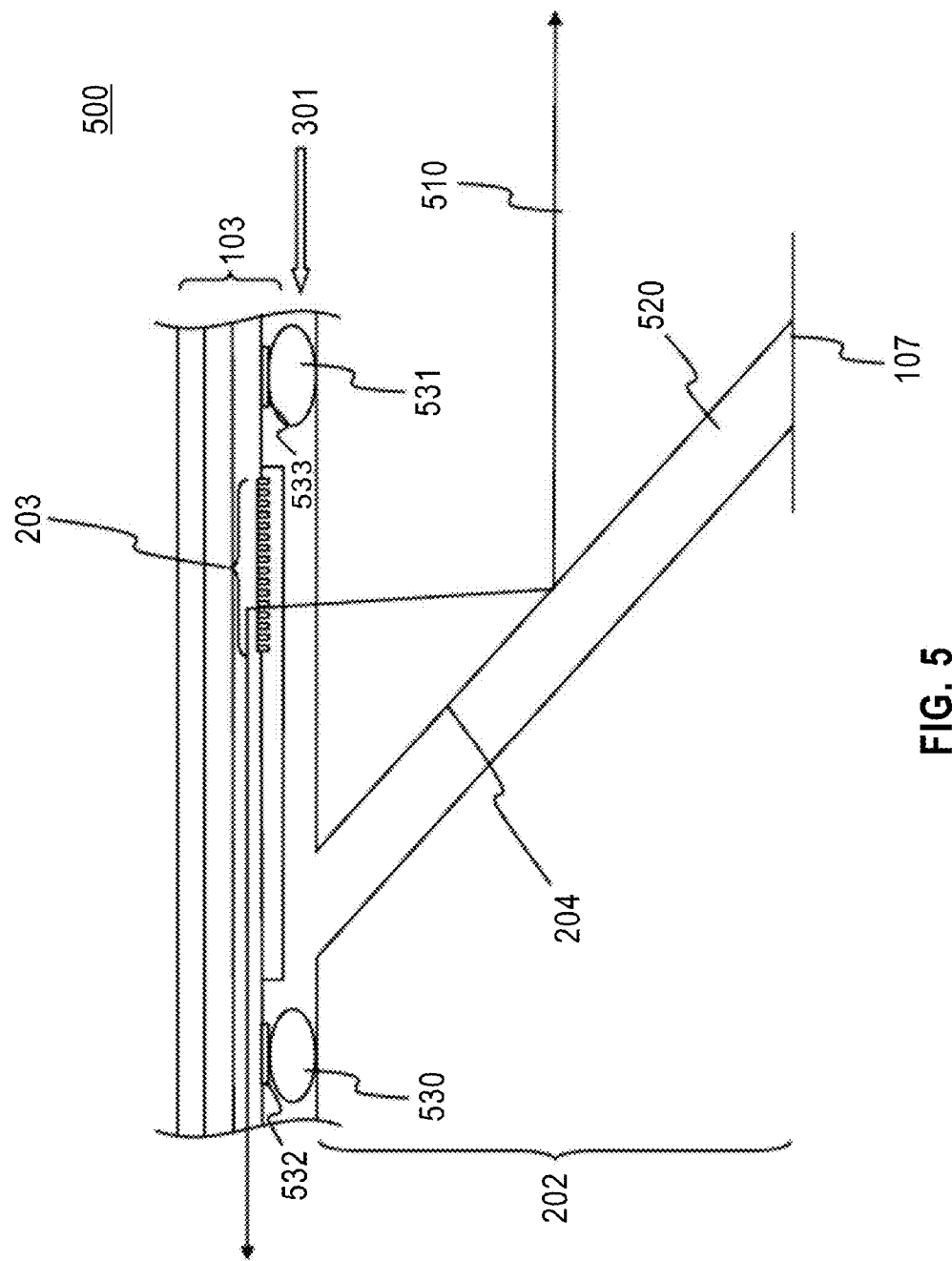
FIG. 5 shows an enlarged construction of the light coupling structure, in accordance with one embodiment of the present invention.

FIG. 5 shows an enlarged construction of a light coupling structure, 500, in accordance with an embodiment of the present invention. Si-Ph chip 103 is mounted over SM-PWG 202 by an appropriate conductive element such as solder balls 530 and 531. Solder balls 530 and 531 ensure a parallel arrangement between Si-Ph chip 103 and SM-PWG 202, while providing a nearly constant gap 301 therebetween. Solder balls 530 and 531 may act as electronic contacts to electrodes 532 and 533, respectively, of Si-Ph chip 103, for example, in flip chip bonding technology.

In one embodiment, one of solder ball 530 or 531 may not provide electrical contact, but may instead be positioned as a "dummy" spacer so as to ensure a parallel configuration with even spacing between Si-Ph chip 103 and SM-PWG 202.

Optical signal (light) 510 is diffracted by DGC 203 and can be reflected by TIR mirror 204 in directions TX and RX. Inner surfaces of TIR mirror 204 may be defined by a polymer material cut by a laser cutting technology leaving void space 520 between the opposite surfaces. This void space 520 provides the difference in the refractive indexes from the polymer materials for providing the appropriate reflection conditions. Void space 520 is typically filled with air, which may provide an appropriate reflection property—though other gases may be used.

FIGS. 6 (A & B) shows two dimensional positioning tolerances of a light coupling structure, in accordance with an embodiment of the present invention. FIG. 6A shows the X-Z tolerance in the TX direction and FIG. 6B shows the X-Z tolerance in the RX direction. Here, the definitions of the Cartesian coordinates are those depicted in FIG. 4. As shown, in FIG. 6 the X-Z tolerances are significantly improved in the Z direction. This is a result of the TIR mirror being formed with slant angle STIR along the Z-direction in both of the TX and RX directions.

In turn, the tolerances in the X-direction may be kept in the interference order of the wavelength of an optical signal. In the depicted example, the wavelength of the light is 1.31 micrometers. The coupling loss in the TX direction can be as low as 1.76 dB and that in the RX direction is as low as 1.89 dB. The tolerance in the Z direction 7.0 micrometers (TX direction) and 3.0 micrometers (RX direction). Both in the TX and RX directions, the decrements of coupling losses are not so significant and positioning in the X direction may be adjusted depending on requirements of a particular implementation—thus allowing a wide variation of positioning between Si-Ph chips 103 and SM-PWG 202.

Figure 7:
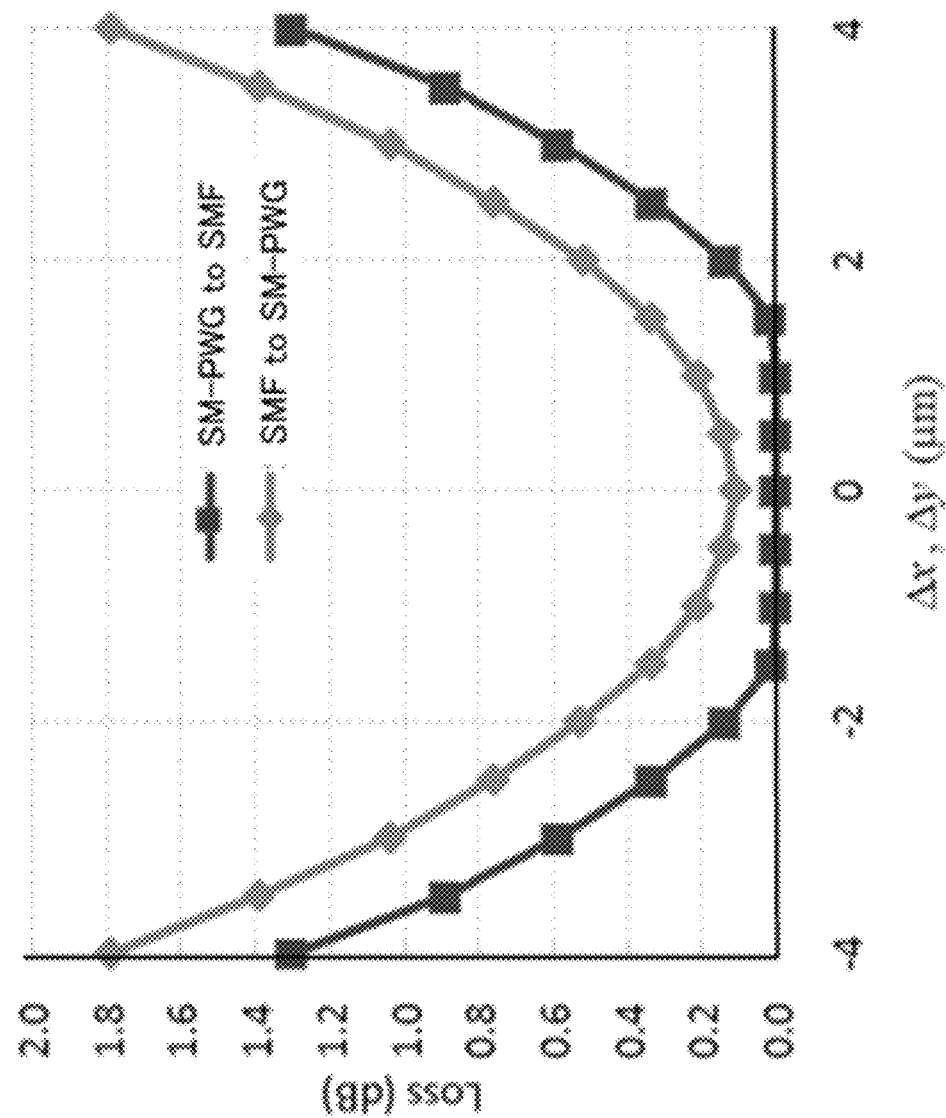
FIG. 7 shows the tolerance in the alignment with a single-mode polymer waveguide (SM-PWG) and a single mode optical fiber (SMF).

FIG. 7 shows tolerance in the alignment with the SM-PWG and the single mode optical fiber. The tolerance in the alignment was evaluated by the light throughput property in both directions for the TX and RX directions according to the following formula:

$$\text{Loss(dB)} = -10 \times \log_{10}\left(\frac{I_{output}}{I_{input}}\right)$$

wherein $I_{input}$ is the light intensity of the input light and $I_{output}$ is the light intensity of the throughput.

As shown in FIG. 7, the coupling losses between SMF and SM-PWG in both directions show almost equal tolerances in the X and Y directions within the acceptable coupling loss, less than about 0.6 dB.

Figure 8:
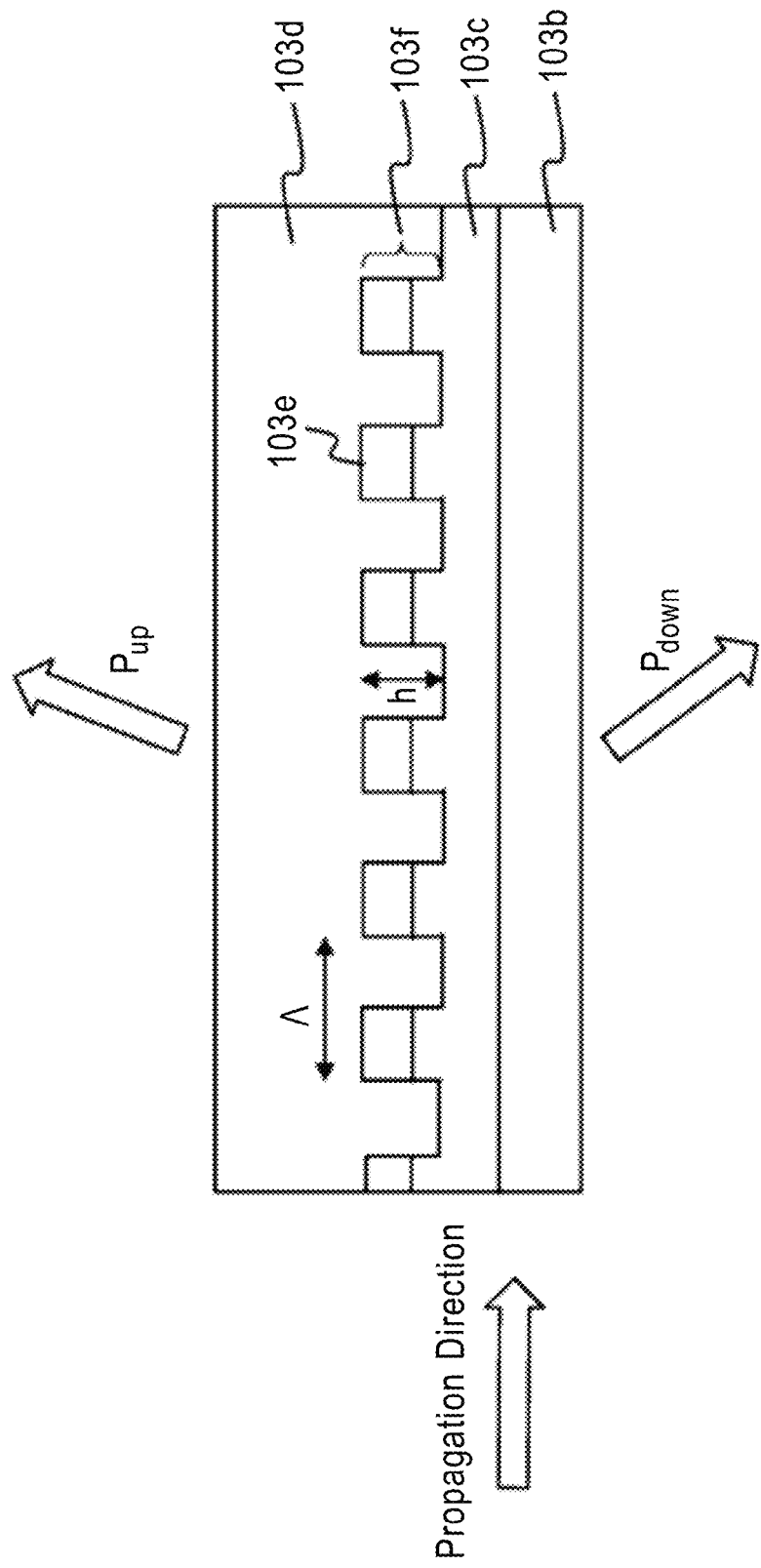
FIG. 8 shows a detailed construction around a diffractive grating coupler, in accordance with one embodiment of the present invention.

FIG. 8 shows a detailed construction around DGC 203 and of light coupling elements, in accordance with an embodiment of the present invention. It is noted that passivation layer 103d is positioned in the upper side of the planar waveguide 103c in the current depiction, and therefore, the entire arrangement is depicted in a reversed orientation relative to FIGS. 3 and 4. The periodic structure having grating period of $\Lambda$ and height h from the bottom to top is formed in the predetermined range of the undermost cladding of Si-Ph chip 103, so as to form DGC 203.

The shape of each periodic ridge is an almost rectangular shape in the described embodiment, but is not limited thereto—the shape of the ridge may differ in alternative embodiments depending on the diffraction performance required. An optical signal propagating in the planer waveguide is diffracted by the periodic grating along two directions ($P_{up}$ and $P_{down}$) as the nature of DGC 203.

In the current depiction and embodiment, the useful light diffraction is $P_{up}$, and improvement of intensity in the $P_{up}$ direction may be achieved by optimization of optical parameters. In addition, in this embodiment, poly-silicon overlay 103e is deposited on the outer surface of DGC 203 so as to improve directionality. Poly-silicon overlay 103e, in one embodiment, may be around 0.15 micrometers. This overlay coating is compatible with standard CMOS processes. Other possible strategies for improving the directionality may also be utilized. Ridge 103f, as depicted, is made up of both poly-silicon overlay 103e and a portion of planer waveguide 103c. The ridge portions of planar waveguide 103c making up the various ridges 103f may be etched from the larger planar waveguide 103c material by photolithography processes to set the ridge height h depending on the desired diffraction efficiency of DGC 203.

Phase matching of the diffraction according to an embodiment of the present invention is defined as follows:

$$n_{top}k_0\sin\theta = n_{eff}k_0 + m\frac{2\pi}{\Lambda}$$

wherein $n_{top}$ is the refractive index of the silicon dioxide used as the passivation layer and $k_0$ is the vacuum wavenumber of light for the optical signal and is given as $k_0=2\pi/\lambda$. The parameter $\theta$ is the diffraction angle of outgoing and/or incoming light to the diffractive grating coupler. The parameter $n_{eff}$ is the effective refractive index in the region of diffractive grating. The parameter m is a positive integer and the parameter $\Lambda$ is the grating period.

The optimization of the phase matching was conducted so as to maximize the directionality D under the given optical parameters. The directionality D is defined as follows:

$$D = \frac{P_{up}}{P_{up} + P_{down}}$$

In the optimization, the directionality was set as the object function under the constraint condition of the optical parameters; the constraint parameters are as follows:

Light wavelength: 1.31 micrometer
Si waveguide thickness: 0.22 micrometer
$SiO_2$ top layer thickness: 0.7 micrometer
$SiO_2$ BOX thickness: 2 micrometer
Poly-Si thickness: 0.15 micrometer
Polymer waveguide core thickness: 8 micrometer
Refractive index of Si(nSi): 3.5074
Refractive index of $SiO_2(nSiO_2)$: 1.4468
Refractive index of polymer core(nco): 1.581
Refractive index of polymer cladding(ncl): 1.576

The grating period ($\Lambda$) and the height of the ridge in the grating (h) were set as the independent parameter.

Figure 9:
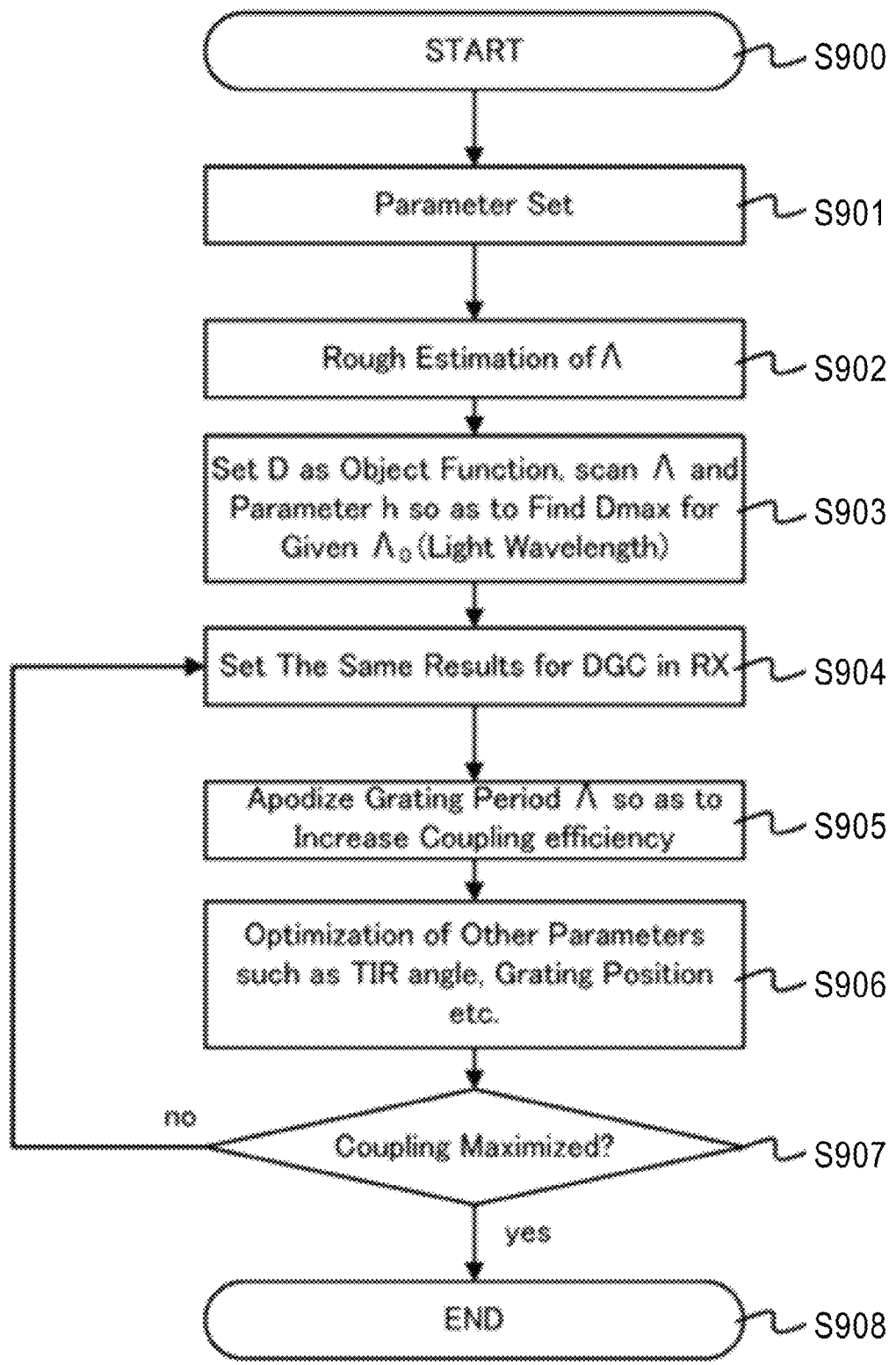
FIG. 9 shows a flow chart of one optimization calculation.

FIG. 9 shows a flow chart for an optimization calculation according to one embodiment of the present invention.

In step S901, initial constraint parameters are set and an initial value of $\Lambda$ is determined using the optical parameters in step S902. In step S903, the directionality D is set as the object function for maximization and the parameters h and $\Lambda$ are scanned for the light wavelength $\lambda$.

In step S904, $\Lambda$ and h are assumed for diffractive grating coupler in the RX direction and in step S905, the grating period $\Lambda$ is further scanned so as to maximize the coupling efficiency $\eta$. Next, in step S906, the optimization of other parameters such as TIR angle $\theta_{TIR}$ and grating position, etc. In another embodiment, optimization of the grating pattern, for example, uneven period of the ridges and widths, may be incorporated into the grating pattern.

In step S907, a determination is performed as to whether or not the coupling efficiency is maximized. If maximized (yes), the process goes to step S908 to end. If not maximized (no), the process returns to step S904 to repeat steps S905-S907 until the determination in the step S907 returns an affirmative result.

As the result of the present optimization on the example measurements previously given, a grating period $\Lambda$ was determined to be 0.47 micrometers and the height of the grating ridge (h) was determined to be 0.19 micrometers.

Figure 10:
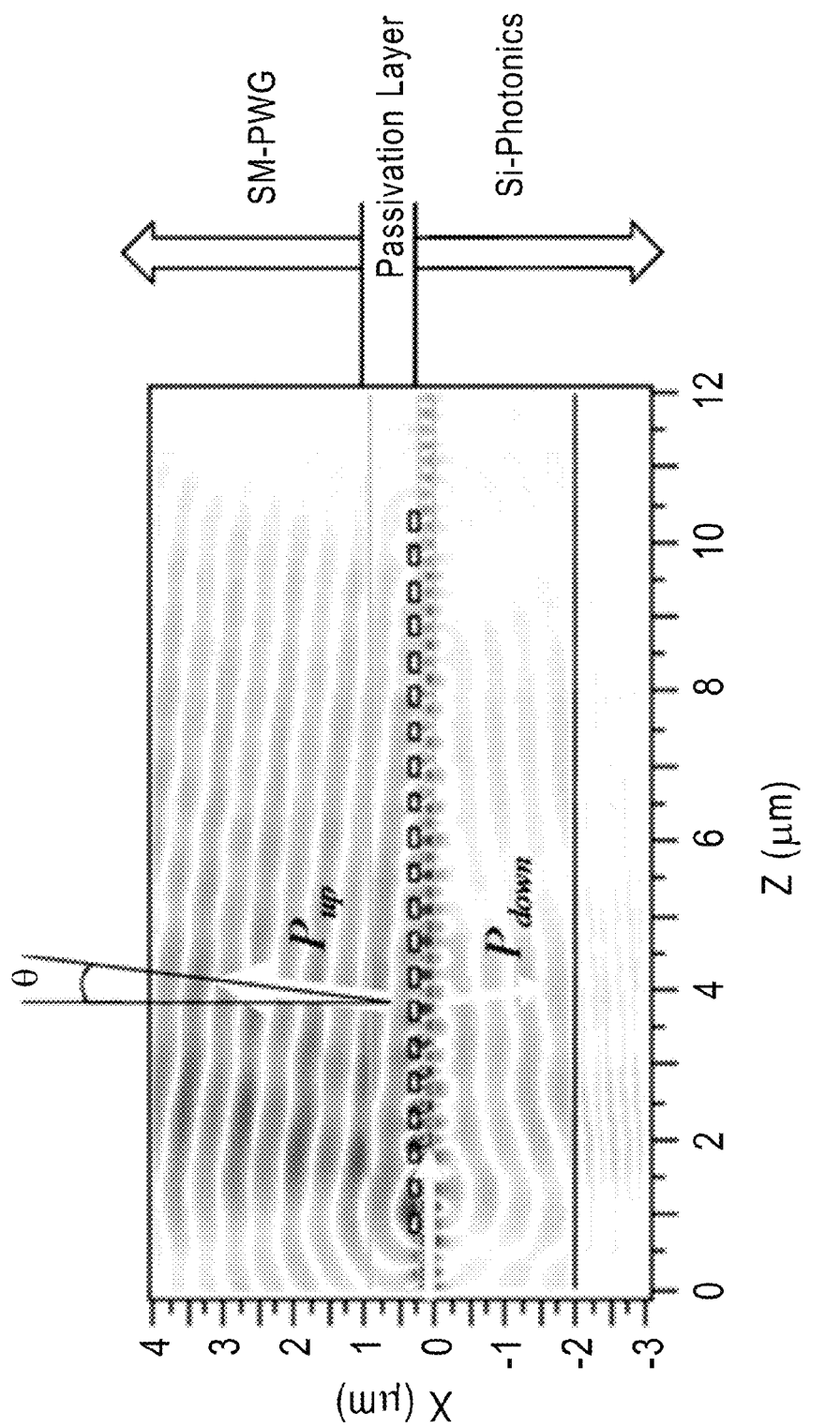
FIG. 10 shows a phase simulation using the optimized result.

FIG. 10 shows a phase simulation map using the optimized result under the conditions described above. In this embodiment, the diffraction angle $\theta$ was determined to be about 6 degrees and directionality D, according to the above formula was 0.9.

Figure 11:
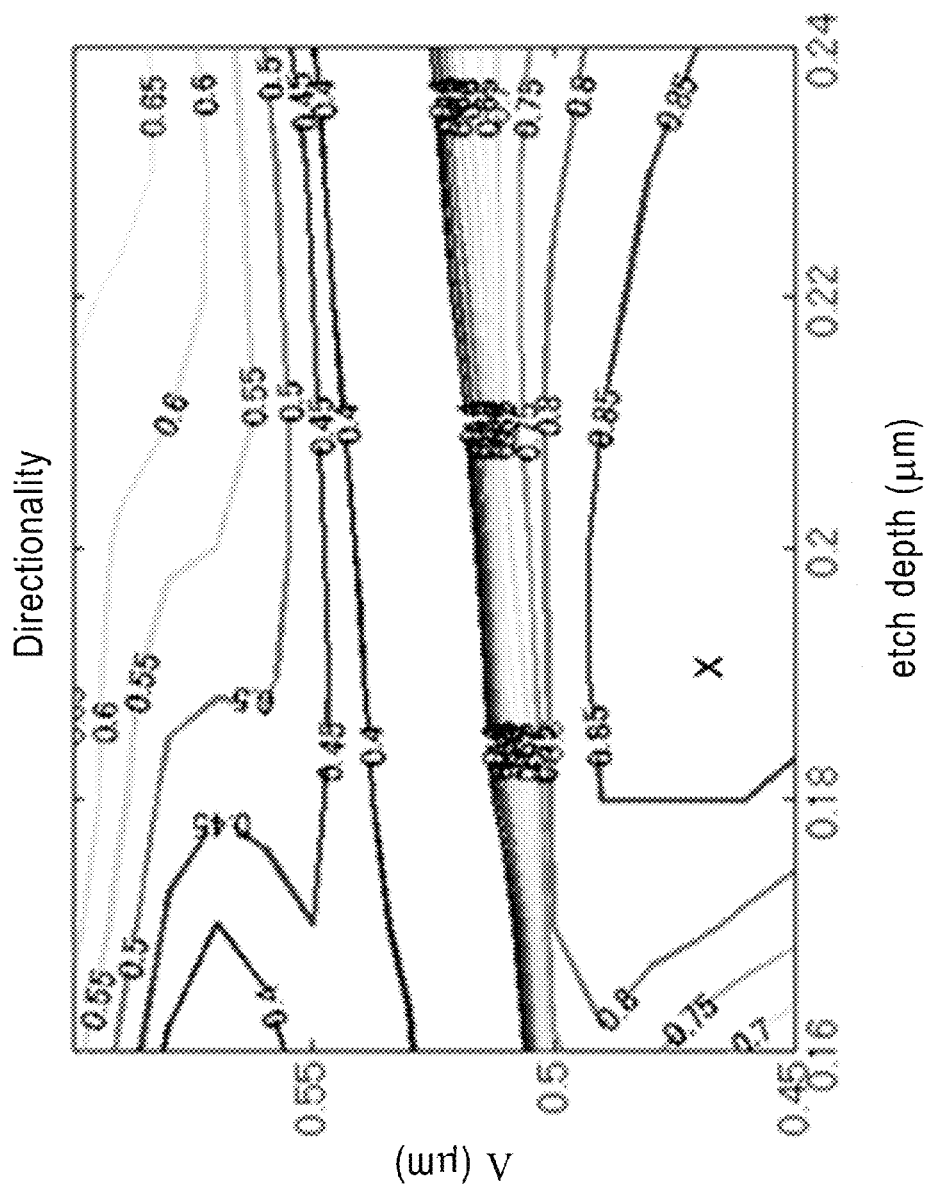
FIG. 11 shows a directionality map obtained by the optimization.

FIG. 11 shows the directionality map obtained by the optimization. The abscissa represents the grating period in micrometers, and the ordinate represents the etch depth (ridge height h) in micrometers. The point "X" is the selected position as the optimization result and the directionality is to be about 0.9 at $\Lambda=0.47$ micrometers and h=0.19 micrometers. Other combinations may be compatible with the depicted embodiment.

Figure 12:
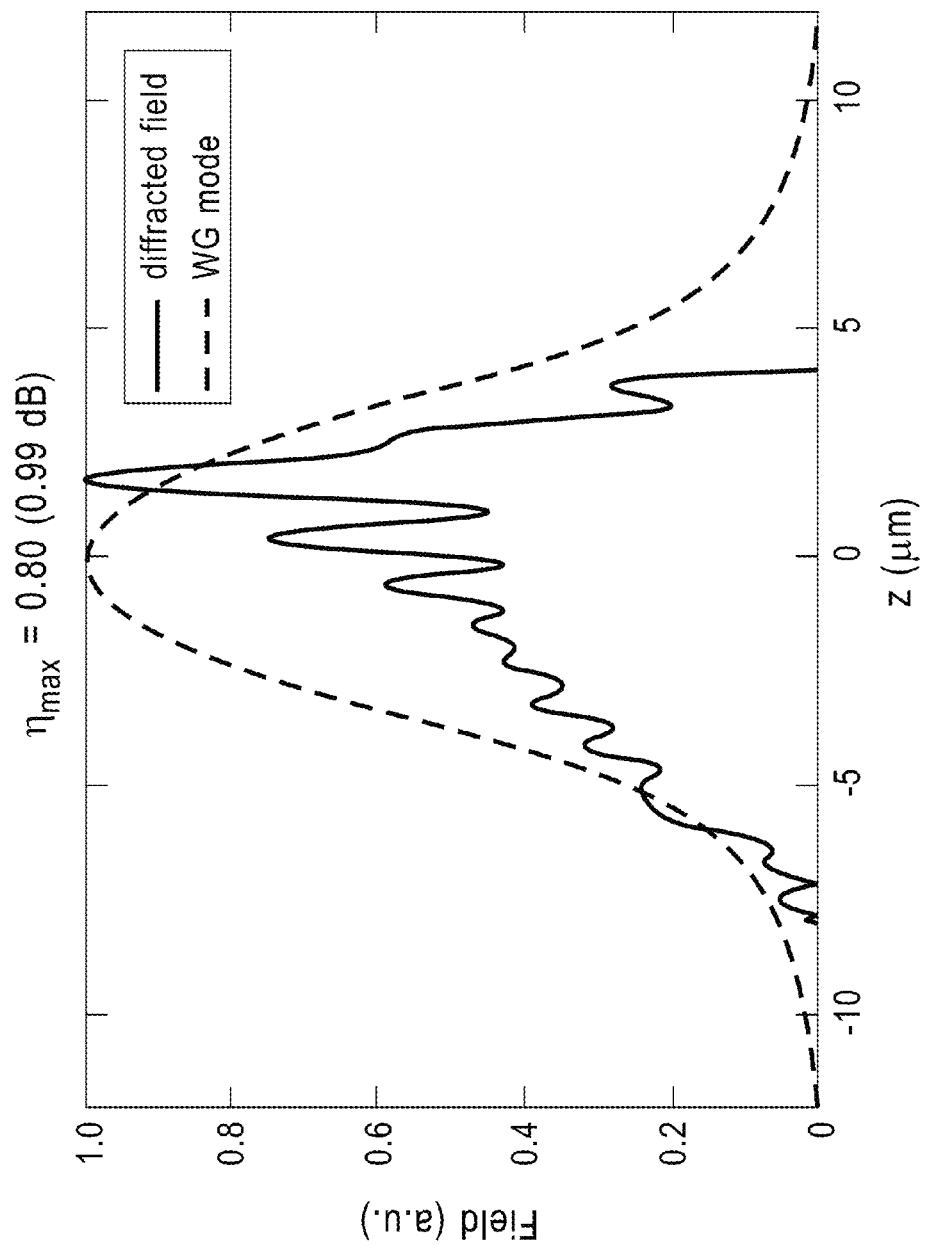
FIG. 12 shows coupling efficiency at the optimized parameters.

FIG. 12 shows the coupling efficiency at the optimized parameters and the maximum coupling efficiency $\eta_{max}$ was 0.80 (0.99 dB). The diffraction of the light occurs ±5 micrometers in the asymmetric profile and this profile may be improved by further optimization of the grating patterns.

FIG. 13 (A-F) shows a production method of diffractive grating coupler 103 according to an embodiment of the present invention. In FIG. 13A, Si-Ph chip 103 is prepared and in FIG. 13B, hard mask 1301 is deposited using known deposition processes and is patterned so as to leave hard mask 1301 to act as a polishing stopper layer.

In FIG. 13C, poly-silicon 1302 is deposited on the underlying structures by using known processes, such as a spin-coating process. Next, in FIG. 13D, the poly-silicon layer is subjected to a chemical-mechanical polishing process (CMP) by using hard mask 1301 as the polishing stopper to leave a thin poly-silicon layer. In FIG. 13E, poly-silicon layer 1302 is subjected to photolithography processes to form DGC 203. In this process, poly-silicon layer 1302 is removed entirely, and further, the undermost planer waveguide 103b may be etched out to obtain the predetermined ridge height for DGC 203 of Si-Ph chip 103. After removing hard mask 1301, the passivation layer is deposited by known deposition methods, such as a chemical vapor deposition, etc. Thus, as shown in FIG. 13F, passivation layer 103d, e.g., a silicon dioxide, is deposited by an appropriate method such as chemical vapor deposition (CVD) followed by known silicon oxide patterning processes.

FIG. 14 (A-D) shows a production process for the semiconductor device in accordance with one embodiment of the present invention. In FIG. 14A, SM-PWG 202 is formed on the organic substrate, such as an epoxy composite, by spin-coating or a dry film lamination method of cladding and core materials followed by the photolithography process. Next, as shown in FIG. 14B, TIR mirror 204 is formed in the proper position and angle by a laser cutting process. The slant angle of TIR mirror 204 is determined by the following conventional classical optical relation:

$$\theta_{TIR} = \frac{\frac{\pi}{2} - \theta}{2}$$

In the example embodiment, if the diffraction angle $\theta$ is to be 6 degrees, then $\theta_{TIR}$ is determined to be 42 degree. In other embodiments, the slant angle $\theta_{TIR}$ may be changed depending on a particular construction of the semiconductor device.

The gap space may be filled with certain inert gas such as air, nitrogen, Ne, Ar, and the like. The via plug 1403 is formed by a photolithography and deposition process of an electric conductive material such as copper. Via plug 1403 may be used as an electric connection to Si-Ph chip 103.

Figure 14A:
FIG. 14 (A-D) shows a production process of the device, in accordance with one embodiment of the present invention.
Figure 14B:
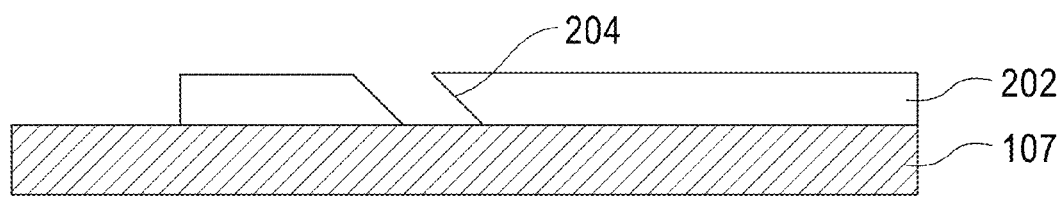
Figure 14C:
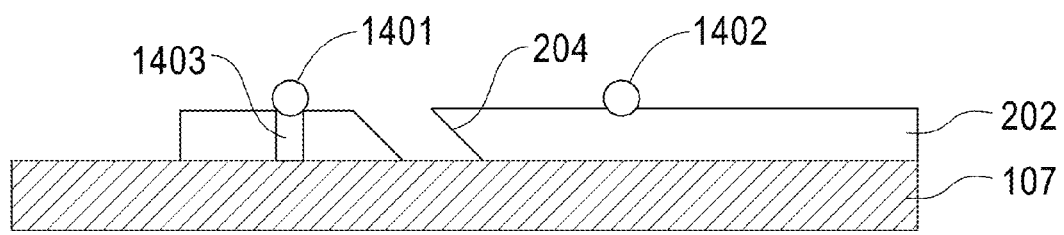

As shown in FIG. 14C, solder ball 1401, acting as an electronic conducting element, and solder ball 1402 are placed on SM-PWG 202 with a proper distance. Solder ball 1401 is contacted to via plug 1403 for electronic connection to Si-Ph chip 103, and solder ball 1402 is used to assist with parallel alignment between SM-PWG 202 and Si-Ph 103. In another embodiment, solder ball 1402 need not be used.

Figure 14D:
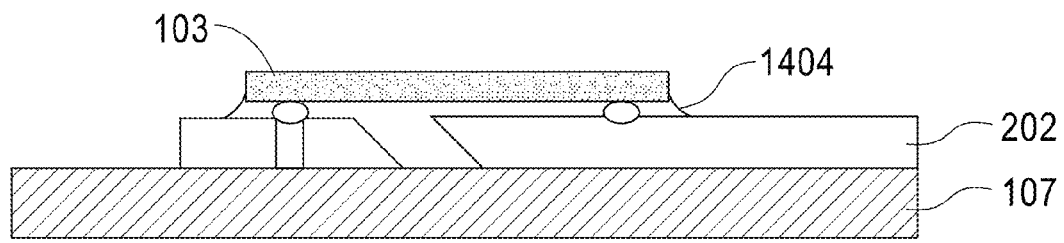

In FIG. 14D, Si-Ph chip 103 is placed on solder balls 1401 and 1402 and is connected by a flip chip bonding process. After the bonding, the gap between Si-Ph 103 and SM-PWG 202 may be sealed by an under-fill material 1404 to complete the semiconductor device implemented with embodiments of light coupling structure 104. Because materials of SM-PWG 202 will typically have a higher glass transition temperature ($T_g$) than the melting point of the solder material, solder ball 1402 (used in this embodiment for maintaining spacing, e.g., parallel gap 301) may be deformed so as to keep the parallel configuration to SM-PWG 202.

The use of both the diffractive grating coupler in conjunction with the angled TIR mirror provides several advantages, in varying embodiments, to a conventional diffractive grating coupling mechanism. One such advantage is large tolerances in light propagation direction and spacing of an existing gap. Another advantage is high process durability and process applicability allowing conventional flip chip bonding. Yet another advantage is that the simplified coupling structure allows for size reduction. All embodiments will not necessarily achieve such advantages.

In other embodiments, the structure of DGC 203 may be modified by placing reflectors on BOX 103b having an optimized BOX thickness for improving the directionality, and the poly-silicon overlay coating may be omitted.

In another embodiment, the diffractive grating may be optimized to provide a variable grating period and/or utilize other strategies so as to improve the directionality. Such optimization may be practiced as a part of the process in step S904.

The present invention has so far been described using practical embodiments; however, the present invention is not limited to the discussed and depicted embodiments in the drawings. A person of skill in the art will recognize that there may be other embodiments, additions, alternatives, and modifications to the described embodiments within the scope of the present invention.

What is claimed is:

1. A light coupling structure comprising:
   a silicon based waveguide including a diffractive grating coupler for directing a light signal;
   a polymer waveguide in which the light signal may propagate between the silicon based waveguide and optical wiring;
   a total internal reflection (TIR) mirror formed within the polymer waveguide at an angle such that at least a portion of the light signal, either directed from the diffractive grating coupler or from the optical wiring via the polymer waveguide, intersects the TIR mirror and is reflected into the other of the diffractive grating coupler or the polymer waveguide, wherein the TIR mirror is a void space defined, at least, by two parallel polymer surfaces inside the polymer waveguide; and
   the optical wiring, optically coupled to the polymer waveguide such that light may pass between the optical wiring and the polymer waveguide.

2. The light coupling structure of claim 1, wherein an air gap separates the silicon based waveguide and the polymer waveguide.

3. The light coupling structure of claim 1, wherein the silicon based waveguide and the polymer waveguide are contacted with a flip chip bonding.

4. The light coupling structure of claim 3, wherein the flip chip bonding includes at least one solder ball between the silicon based waveguide and the polymer waveguide providing an electrical connection, and at least one other solder ball between the silicon based waveguide and the polymer waveguide having no electrical connection and maintaining a spacing relationship between the silicon based waveguide and the polymer waveguide.

5. A semiconductor device comprising:
   a silicon photonics chip formed by a silicon-on-insulator (SOI) structure and including a silicon based waveguide with a diffractive grating coupler on a buried oxide layer of the SOI structure;
   a polymer waveguide in which a light signal may propagate between the silicon photonics chip and a separate optical medium; and
   a total internal reflection (TIR) mirror formed within the polymer waveguide at an angle such that at least a portion of a light signal traveling from either the silicon photonics chip or the polymer waveguide intersects the TIR mirror and is reflected towards the other of the silicon photonics chip or the polymer waveguide, wherein the TIR mirror is a void space at least defined by polymer surfaces inside the polymer waveguide.

6. The semiconductor device of claim 5, further comprising an organic substrate connected to the polymer waveguide and including at least one data processing unit, wherein the data processing unit is electronically coupled to the silicon photonics chip.

7. The semiconductor device of claim 6, further comprising a conductive via plug passing through the polymer waveguide through which electrical signals may pass between the silicon photonics chip and the organic substrate.

8. The semiconductor device of claim 5, wherein the silicon photonics chip and the polymer waveguide are contacted with a flip chip bonding.

9. A method for forming a light coupling structure, the method comprising the steps of:
   forming a polymer waveguide on an organic substrate;
   determining an optimum angle for a total internal reflection (TIR) mirror based on an expected diffraction angle of a diffractive grating coupler to be used in conjunction with the polymer waveguide;
   removing an angular portion of the polymer waveguide such that an angled void is created, substantially equivalent to the determined optimum angle, within the polymer waveguide, the angled void having at least two parallel surfaces to create a total internal reflection (TIR) mirror;
   forming a via plug filled with an electric conducting material in the polymer waveguide; and
   soldering a silicon photonics chip, having a diffractive grating coupler, to the via plug such that electric signals may pass between the silicon photonics chip and the polymer waveguide by way of the via plug, the silicon photonics chip positioned such that at least a portion of a light signal traveling from the polymer waveguide can be directed at the diffractive grating coupler by the TIR mirror and at least a portion of a light signal traveling from the silicon photonics chip can be directed at the TIR mirror by the diffractive grating coupler.

10. The method of claim 9, wherein the step of forming the polymer waveguide further comprises layering a clad polymer, a core polymer, and another clad polymer by a spin-coating or dry film lamination sequence.

11. The light coupling structure of claim 1, wherein directionality of propagated light through the diffractive grating coupler is optimized via the phase matching formula $$n_{top}k_0\sin\theta = n_{eff}k_0 + m\frac{2\pi}{\Lambda}$$

wherein $n_{top}$ is the refractive index of a passivation layer of the diffractive grating coupler and $k_0$ is a vacuum wavenumber of light for an optical signal and is given as $k_0=2\pi/\lambda$; $\theta$ is the diffraction angle of outgoing and/or incoming light to the diffractive grating coupler; parameter $n_{eff}$ is the effective refractive index in a region of diffractive grating; and parameter m is a positive integer and parameter $\Lambda$ is the grating period.

12. The light coupling structure of claim 11, wherein the diffraction angle of the diffractive grating coupler is optimized to approximately 6 degrees.

13. The light coupling structure of claim 1, wherein ridges of the diffractive grating coupler are comprised of both raised portions of the silicon based waveguide and a polysilicon overlay on the raised portions.

14. The light coupling structure of claim 1, wherein the void space is filled with an inert gas.

15. The semiconductor device of claim 5, wherein directionality of propagated light through the diffractive grating coupler is optimized via the phase matching formula $$n_{top}k_0\sin\theta = n_{eff}k_0 + m\frac{2\pi}{\Lambda}$$

wherein $n_{top}$ is the refractive index of a passivation layer of the diffractive grating coupler and $k_0$ is a vacuum wavenumber of light for an optical signal and is given as $k_0=2\pi/\lambda$; $\theta$ is the diffraction angle of outgoing and/or incoming light to the diffractive grating coupler; parameter $n_{eff}$ is the effective refractive index in a region of diffractive grating; and parameter m is a positive integer and parameter $\Lambda$ is the grating period.

16. The semiconductor device of claim 5, wherein the void space is filled with an inert gas selected from a group consisting of nitrogen, He, Ne, Ar, and $CO_2$.

17. The method of claim 9, wherein the optimum angle for the TIR mirror can be determined according to the formula $((\pi/2)-\theta)/2$, where $\theta$ is the expected diffraction angle of the diffractive grating coupler.

* * * * *